(12) United States Patent
Pritchard et al.

(10) Patent No.: US 7,409,667 B1
(45) Date of Patent: Aug. 5, 2008

(54) TECHNIQUES FOR MODELING A CIRCUIT BOARD STRUCTURE

(75) Inventors: Jason Pritchard, Hopkinton, MA (US); Venkat Raghavan Satagopan, Rolla, MO (US)

(73) Assignee: EMC Corporation, Hopkinton, MA (US)

( * ) Notice: Subject to any disclaimer, the term of this patent is extended or adjusted under 35 U.S.C. 154(b) by 274 days.

(21) Appl. No.: 11/303,602

(22) Filed: Dec. 15, 2005

(51) Int. Cl.
    *G06F 17/50* (2006.01)
(52) U.S. Cl. .................. 716/15; 716/1; 716/4; 716/11
(58) Field of Classification Search .................. 716/1, 716/4, 11, 15
    See application file for complete search history.

(56) References Cited

U.S. PATENT DOCUMENTS

| | | | |
|---|---|---|---|
| 5,353,234 A | 10/1994 | Takigami | |
| 5,675,521 A * | 10/1997 | Holzhauer et al. | 716/20 |
| 6,530,069 B2 | 3/2003 | Jennion et al. | |
| 6,584,608 B1 | 6/2003 | Kumada et al. | |
| 6,662,345 B2 * | 12/2003 | Uchida et al. | 716/1 |
| 6,678,874 B1 * | 1/2004 | Jochym et al. | 716/11 |
| 6,795,950 B2 * | 9/2004 | Matsushita et al. | 716/4 |
| 6,829,749 B2 | 12/2004 | Osaka et al. | |
| 6,987,307 B2 * | 1/2006 | White et al. | 257/508 |
| 7,131,080 B2 * | 10/2006 | Chen et al. | 716/4 |
| 7,263,674 B2 * | 8/2007 | Lorenz | 716/4 |
| 2004/0010766 A1 * | 1/2004 | Swope | 716/15 |
| 2006/0095882 A1 * | 5/2006 | Mankin et al. | 716/11 |
| 2006/0101368 A1 * | 5/2006 | Kesarwani et al. | 716/11 |

* cited by examiner

*Primary Examiner*—Jack Chiang
*Assistant Examiner*—Helen Rossoshek
(74) *Attorney, Agent, or Firm*—BainwoodHuang

(57) ABSTRACT

A technique generates circuit board modeling data for a circuit board structure having multiple layers. The technique includes receiving a set of global circuit board dimension parameters from a user. The set of global circuit board dimension parameters defines a set of global circuit board dimensions of the circuit board structure. The technique further includes forming, for each layer, a set of individual circuit board dimension parameters defining a set of individual circuit board dimensions for that layer based on the set of global circuit board dimension parameters. The technique further includes providing a script for use by a 3D modeling subsystem. The script includes a set of circuit board design values based on the set of individual circuit board dimension parameters formed for each layer. Other properties such as layer width and thickness, via dimensions, etc. are handled in a similar manner.

20 Claims, 7 Drawing Sheets

TECHNIQUES FOR MODELING A CIRCUIT BOARD STRUCTURE

BACKGROUND

A conventional approach to modeling a printed circuit board (PCB) design requires a user to manually enter specific dimensional data for individual circuit board layers and vias (or plated-through holes) into a script. Typically, the script takes the form of a standard format. Examples of such formats include .vbs files, mod files (design files) and par files (parameter files), among others.

The user then inputs the script into a modeling tool which enables the user to analyze and debug various aspects of the circuit board design (e.g., to determine changes in impedance as a way of identifying potential signal reflection sources, etc.). Examples of modeling tools which are adapted to receive scripts and then model circuit board designs in manners similar to that mentioned above include three-dimensional (3D) modeling applications from Ansoft HFSS of Pittsburgh, Pa. and from CST Microwave Studio of Wellesley Hills, Mass.

To make a change in the circuit board design, the user makes a modification to the specific dimensional data. For example, to change the width of the circuit board design, the user changes the width in each individual circuit board layer. Similarly, to change the thickness of a circuit board layer along the Z-axis, the user changes the Z-axis positions of each individual circuit board layer as well as the via height value of each via.

SUMMARY

Unfortunately, there are deficiencies to the above-described conventional approach to modeling a circuit board design which requires the user to manually enter specific dimensional data for individual circuit board layers and vias. In particular, the approach is highly rigid and often requires the user to tediously change the data for several circuit board features in order to effectuate a minor dimensional change. For example, the user is required to change the individual width values for each circuit board layer when modifying the width of the overall circuit board design. As another example, the user is required to individually calculate and change the Z-axis positions of each circuit board layer and individually change the via height of each via when modifying the thickness of one circuit board layer. Accordingly, the above-described conventional approach to modeling a circuit board design is extremely burdensome and prone to user error.

In contrast to the above-described conventional approach to modeling a circuit board design, improved techniques utilize parameterization of particular circuit board dimensions to enable automatic propagation of changes to individual aspects of a circuit board design thus alleviating the need for a user to manually change certain the information for multiple circuit board layer and via properties. For example, if the user changes the thickness of a particular circuit board layer, the Z-positions of the other circuit board layers and the via heights are automatically updated so that the user does not need to manually calculate and change the Z-axis positions of other circuit board layers and so that the user does not need to manually change the via heights of any of the vias. Accordingly, the improved techniques save time and effort as well as reduce the likelihood of user error.

One embodiment is directed to a method for generating circuit board modeling data for a circuit board structure having multiple layers. The method includes receiving a set of global circuit board dimension parameters from a user. The set of global circuit board dimension parameters defines a set of global circuit board dimensions of the circuit board structure, e.g., a global circuit board width and length. The method further includes forming, for each layer of the multiple layers of the circuit board structure, a set of individual circuit board dimension parameters defining a set of individual circuit board dimensions for that layer based on the set of global circuit board dimension parameters, e.g., an individual layer width and length. The method further includes providing a script for use by a three-dimensional modeling subsystem configured to three-dimensionally model the circuit board structure. The script includes a set of circuit board design values based on the set of individual circuit board dimension parameters formed for each layer of the multiple layers of the circuit board structure. Accordingly, if the user chooses to modify a property of the circuit board structure such as a length of the circuit board structure, the user is capable of simply changing the global circuit board length (i.e., a global parameter) and then allowing the individual circuit board dimension parameters for individual circuit board layer lengths to be based on the global circuit board length.

As a result, the user does not need to manually change the individual circuit board dimension parameters for individual circuit board layer lengths which, if required, would be tedious and prone to error. The process works in a similar manner and provides similar advantages when the user wishes to handle other properties such as circuit board width, layer thicknesses, via properties, and so on.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

An improved technique utilizes parameterization of particular circuit board dimensions to enable automatic propagation of changes to individual aspects of a circuit board design thus alleviating the need for a user to manually change certain the information for multiple circuit board layer and via properties. For example, if the user changes the thickness of a particular circuit board layer, the Z-positions of the other circuit board layers and the via heights are automatically updated so that the user does not need to manually calculate and change the Z-axis positions of other circuit board layers and so that the user does not need to manually change the via heights of any of the vias. Accordingly, the improved technique saves time and effort as well as reduces the likelihood of user error.

Figure 1:
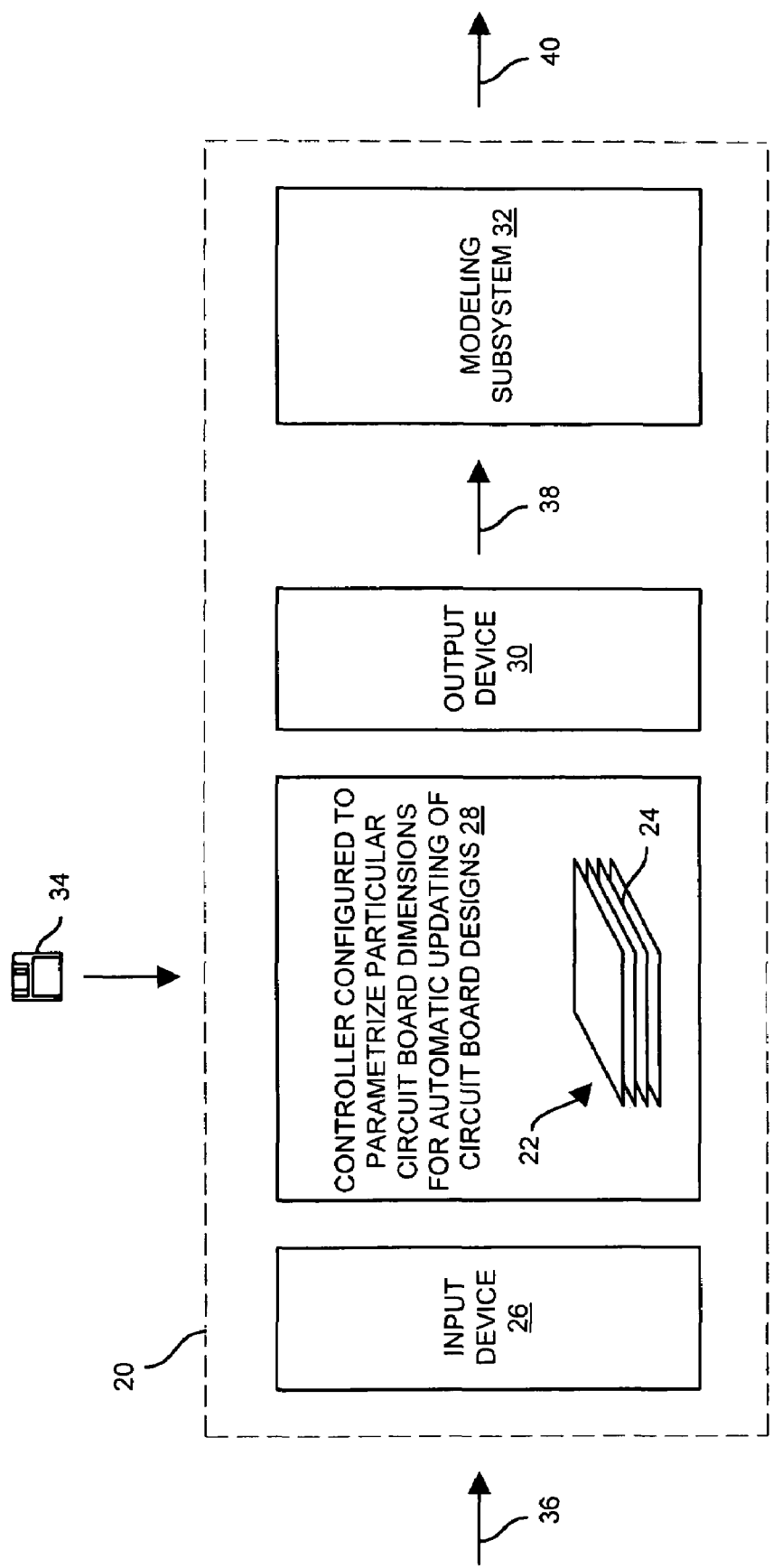
FIG. 1 is a block diagram of an apparatus which is suitable for modeling a circuit board design using parameterization.

FIG. 1 shows an apparatus 20 which is suitable for modeling a circuit board structure (or design) 22 having multiple layers 24 using parameterization. The apparatus 20 includes an input device 26 (e.g., a graphical user interface), a controller 28, an output device 30 (e.g., non-volatile storage for storing scripts), and a three-dimensional (3D) modeling subsystem 32. The input device 26, the controller 28 and the output device 30 can reside locally relative to the modeling subsystem 32 (e.g., at the same location), or alternatively reside in a remote location relative to the modeling subsystem 32 (e.g., physically detached from the modeling subsystem 32 but nevertheless connected to the modeling subsystem 32 over a network).

In some arrangements, the apparatus 20 is a computerized device (e.g., a general purpose computer) running a computer program product 34. In these arrangements, the computer program product 34 includes a computer readable medium having instructions which direct the operation of the computerized device. Although the computer program product 34 is illustrated in FIG. 1 as a diskette by way of example only, a variety of communications and storage media are suitable for use (e.g., a set of CD-ROMs, tapes, memory cards or sticks, network downloads, propagated signals, combinations thereof, etc.).

During operation, the apparatus 20 is configured to receive circuit board information 36 defining the circuit board structure 22 from a user, provide a script 38 having a variety of modeling parameters which are based on the circuit board information 36, and generate results 40 which model the circuit board structure 22 based on the script 38. In particular, the user enters the circuit board information 36 into the apparatus 20 through the input device 26 (e.g., a GUI). The controller 28 parameterizes at least some of the circuit board information 36 and then produces the script 38 based on such parameterization. That is, the controller 28 defines certain circuit board properties (e.g., values representing the length and width of the circuit board structure 22, offsets between vias, etc.) using global parameters or variables which are then accessed to define other circuit board properties. It should be noted that the parameterized data 72 is made available to the modeling subsystem 32, when the script 38 is loaded into the modeling subsystem 32. The output device 30 provides the script 38 to the modeling subsystem 32 which produces the modeling results 40.

The user is then capable of analyzing the modeling results 40 and adjusting the circuit board design 22 based on the results 40. In particular, if the user wishes to change the circuit board design 22, the user can make certain modifications to the circuit board design 22 by simply changing certain corresponding global variables without manually changing other variables individually. Accordingly, the parameterization capabilities of the controller 28 enables the user to make minimal parameter adjustments and conveniently rely of the controller 28 to propagate those adjustments to other variables in an automated manner. The apparatus 20 allows the user to make these automated parameter adjustments at two different stages in the design process. The user can modify the circuit board parameters initially before the script 38 is created through the input device 26 and later after the script is created in modeling subsystem 32. Such convenience enables the user to quickly simulate possible changes to the circuit board design 22 in order to optimize performance. Further details will now be provided with reference to FIG. 2.

Figure 2:
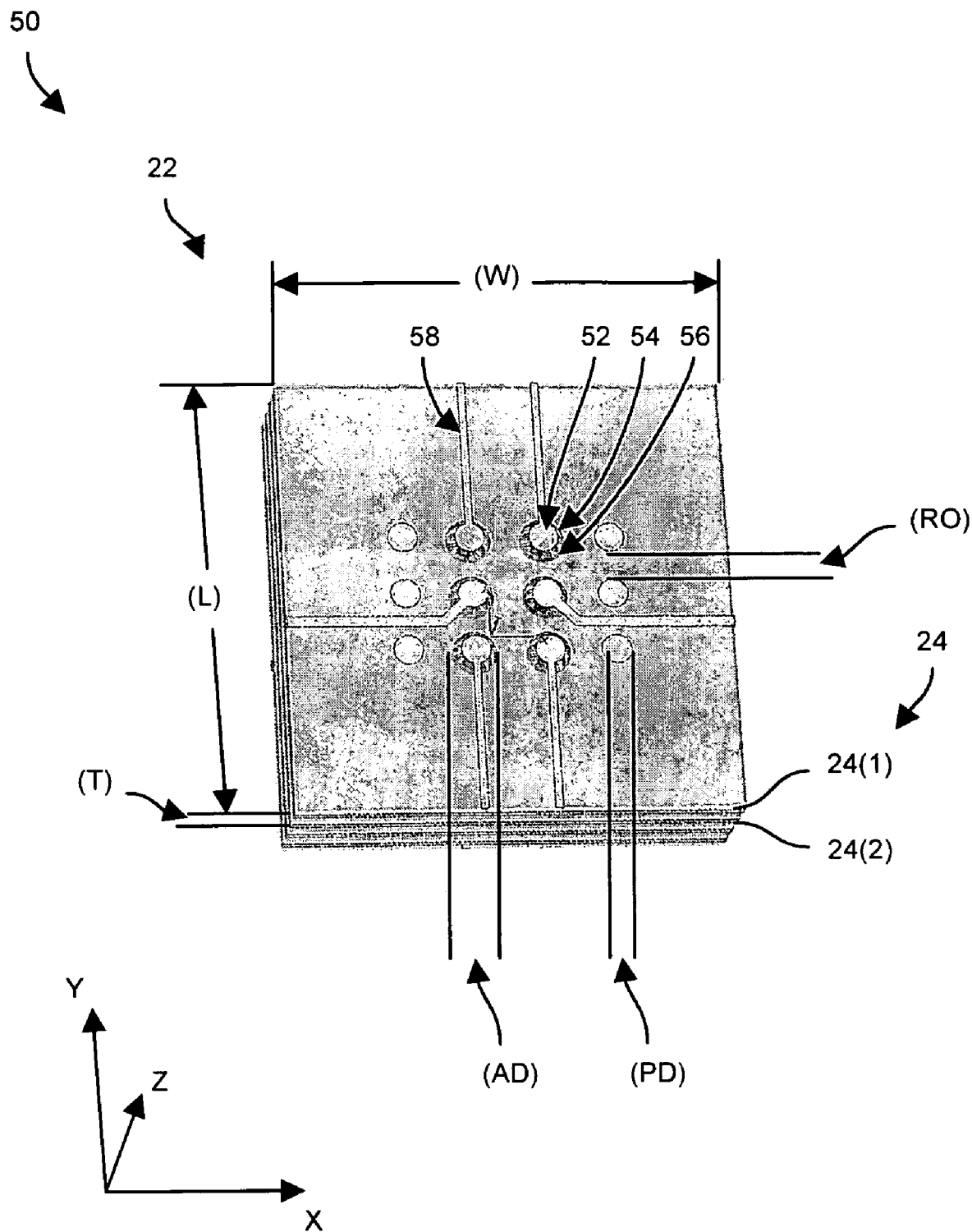
FIG. 2 is a general view of a circuit board design which is modeled by the apparatus of FIG. 1.

FIG. 2 is a perspective view 50 of an exemplary circuit board structure 22 which is capable of being modeled by the apparatus 20 of FIG. 1. As shown in FIG. 2, the circuit board structure 22 includes circuit board layers 24(1), 24(2), . . . (collectively, circuit board layers 24), vias 52, pads 54, antipads 56, and traces 58, among other things. The layers 24 are substantially parallel to each other and extend in a respective X-Y plane. Furthermore, the layers 24 are stacked upon each other along the Z-axis and thus have associated Z-positions (e.g., a Z-coordinate for the top of each layer 24, and a Z-coordinate for the bottom of each layer 24). The vias 52 extend in the Z-direction through the layers 24. The pads 54, antipads 56 and traces 58 lie within particular layers 24.

In order to model the circuit board structure 22, the user defines values for a variety of dimensional properties. Such values include a circuit board structure length (L), a circuit board structure width (W), a thickness (T) for each layer 24, a pad diameter (PD) for the pads 54, an anti-pad diameter (AD) for the anti-pads 56, a row offset (RO) for the distances between via rows. Values for other properties are suitable for use as well such as a via diameter for the vias 52, via-to-via spacing, via-to-ground spacing, an input layer name for the vias 52, an output layer name for the vias 52, a column offset for the distances between via columns, a top trace-width for the top width of the traces 58, a bottom trace-width for the bottom width of the traces 58, an input layer name for the traces 58, an output layer name for the traces 58, and so on. Further details will now be provided with reference to FIG. 3.

Figure 3:
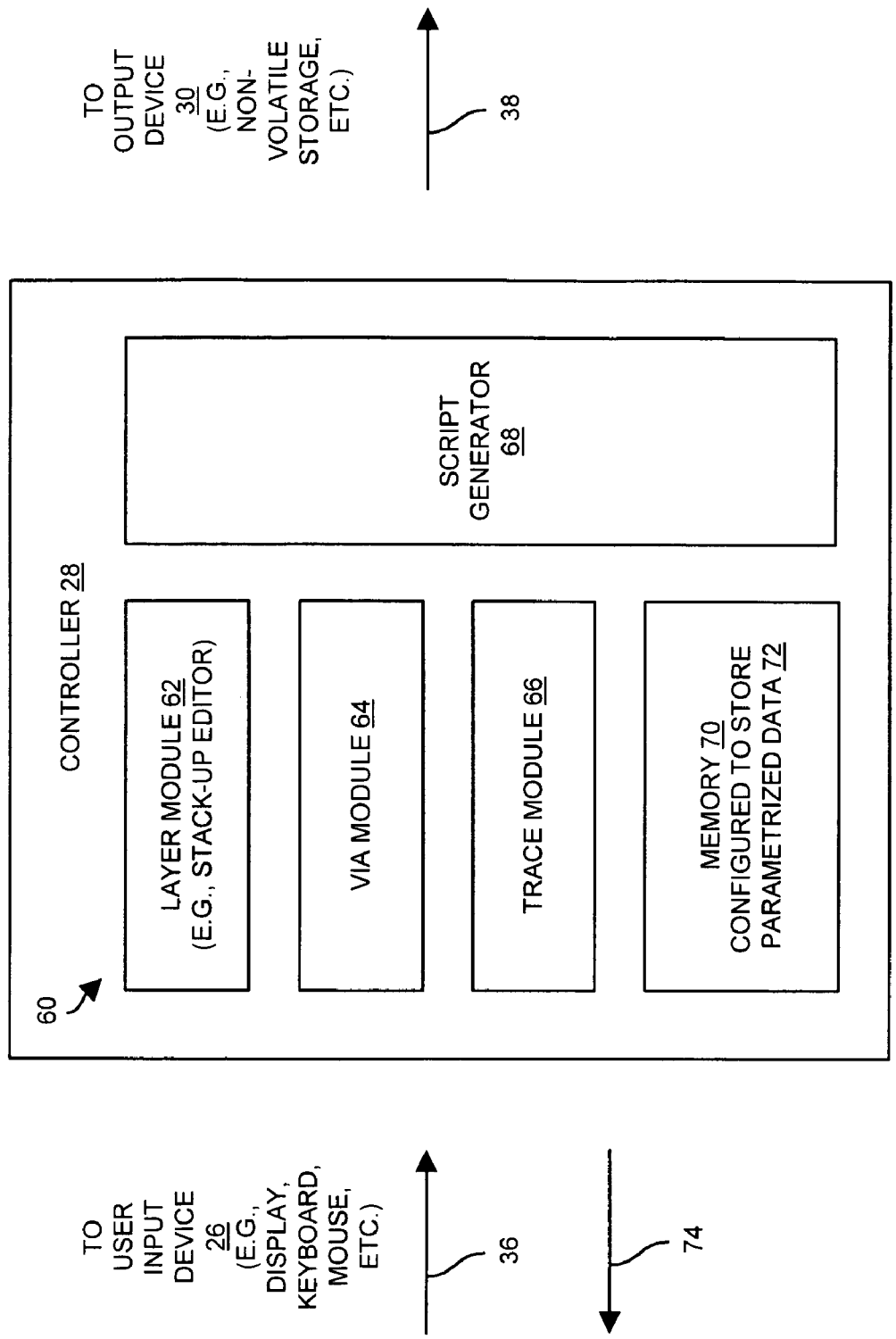
FIG. 3 is a block diagram of a controller of the apparatus of FIG. 1.

FIG. 3 is a block diagram of various modules 60 within the controller 28. The controller 28 includes a layer module 62, a via module 64, a trace module 66 and a script generator 68 (collectively, modules 60). The controller 28 further includes memory 70 for storing, among other things, parameterized data 72.

As mentioned earlier, in some arrangements, the apparatus 20 is a computerized device running in accordance with a computer program product 34. In these arrangements, the controller 28 is essentially a processing circuit (i.e., one or more microprocessors) executing code stored within memory. As such, the controller 28 forms the modules 60 when executing particular portions of code, and the parameters 80 are software constructs (e.g., data structures) in memory. In other arrangements, the controller 28 is formed by other types of electronics such as Application Specific Integrated Circuits (ASICs), Field Programmable Gate Arrays (FPGAs), discrete digital components, analog circuitry, combinations thereof, etc.

Generally, each module 60 is responsible for collecting information/properties for specific 3D shapes from the user through the input device 26. Along these lines, the input device 26 (e.g., a display terminal and mouse/keyboard) is under control of the controller 28 which renders a graphical user interface (GUI) (illustrated generally by the arrow 74 pointing from the controller 28 to the input device 26 in FIG. 3) through which the user inputs and confirms the user information 36 at different stages of the circuit board structure modeling process. As the user enters the user information 36, the modules 60 store at least some of the information 36 as parameterized data 72. Such parameterization enables the user to later change a particular property value in a single operation (e.g., a change in the circuit board structure length (L)) without having to manually make the change to multiple components of the circuit board structure 22 (e.g., without having to manually change the length value for each layer 24). Rather, the user makes a single change and the controller 28 responds by automatically propagating the change to other data structures which are linked to the particular property value.

Figure 4:
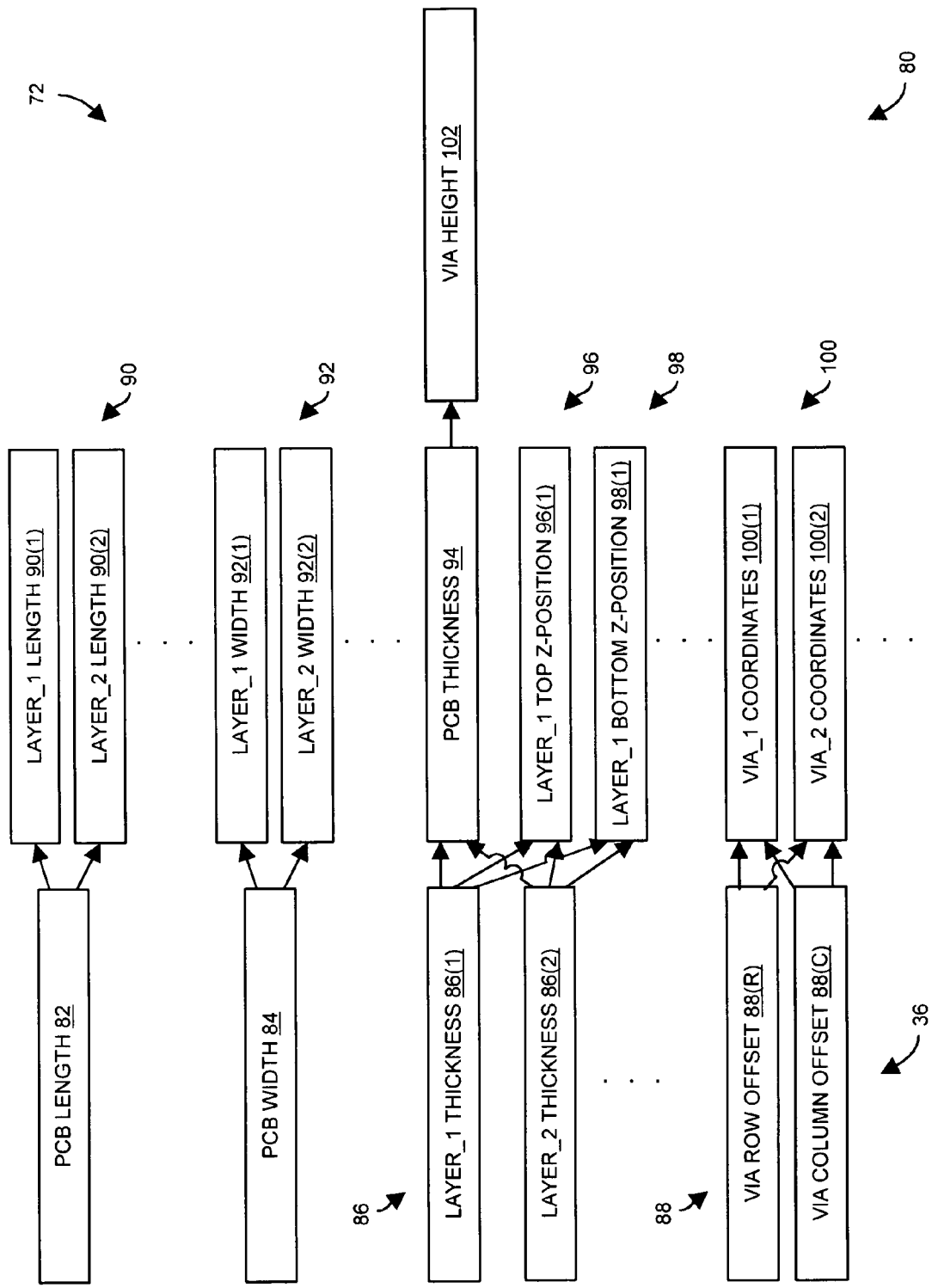
FIG. 4 is a block diagram of a variety of parameters which are handled by the apparatus of FIG. 1.

FIG. 4 is a block diagram of a variety of variables 80 which are managed by the controller 28 (e.g., see the parameterized data 72 within the memory 70 of FIG. 3). It should be understood that these variables 80 store the parameterized data 72 that the particular data shown are provided by way of example only and that other variables 80 are suitable for use by the apparatus 20 as well. The leftmost variables 80 contain the user information 36 which the user has input into the apparatus 20. The variables 80 to the right of the leftmost variables 80 contain dependent values which are automatically updated based on changes to the user information 36, and so on. That is, as illustrated by the arrows in FIG. 3, the values stored within the variables 80 on the right side depend on the values stored within the variables 80 on the left side.

As shown in FIG. 4, the variables 80 include a PCB length variable 82 configured to contain a value identifying a length of the circuit board structure 22, and a PCB width variable 84 configured to contain a value identifying a width of the circuit board structure 22. The variables 80 further include layer thickness variables 86, i.e., a variable 86(1) for defining a thickness of a first layer 24, a variable 86(2) for defining a thickness of a second layer 24, and so on. The variables 80 further include a row offset variable 88(R) for defining an offset value between via rows, and a column offset variable 88(C) for defining an offset value between via columns (collectively, via offsets 88).

As further shown in FIG. 4, the variables 80 further include layer length variables 90, i.e., a variable 90(1) for defining a length of a first layer 24, a variable 90(2) for defining a length of a second layer 24, and so on. Similarly, the variables 80 further include layer width variables 92, i.e., a variable 92(1) for defining a width of a first layer 24, a variable 92(2) for defining a width of a second layer 24, and so on.

Further variables 80 include a PCB thickness variable 94 for defining an overall thickness of the circuit board structure 22, variables 96, 98 defining Z-positions for each layer 24 (e.g., a first layer top Z-position variable 96(1), a first layer bottom Z-position variable 98(1), ... ), variables 100 defining via coordinates (e.g., a first set of via coordinate variables 100(1), a second set of via coordinate variables 100(2), ... ), and a via height parameter defining a via height for the vias 52 (also see the vias 52 in FIG. 2). Each set of via coordinates is capable of defining the geometry of a particular via along the X, Y and Z axes as shown in FIG. 1. Further details will now be provided with reference to various modeling examples and FIGS. 5 through 7.

Figure 5:
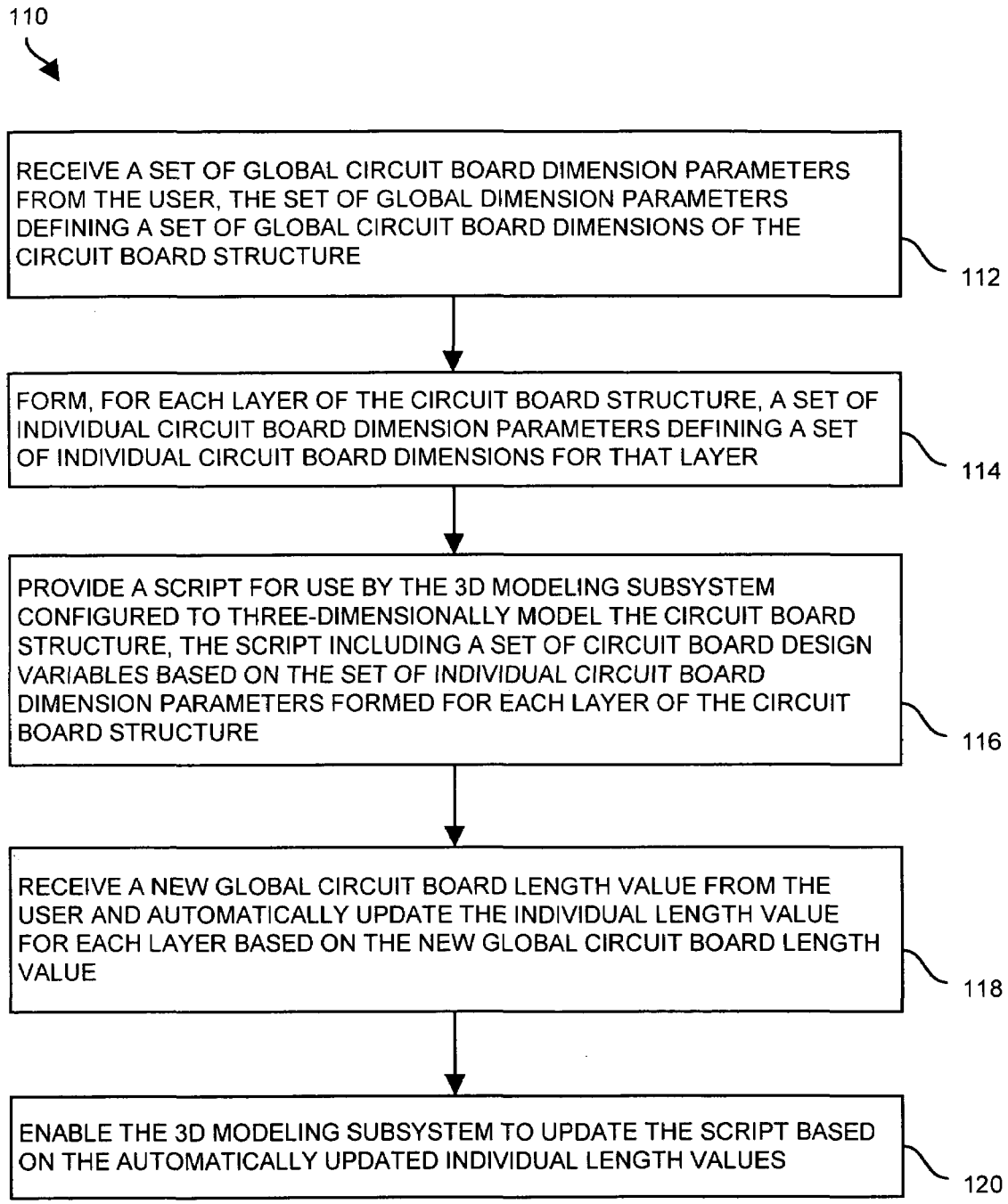
FIG. 5 is a flowchart of a procedure which is performed by the apparatus of FIG. 1 when a user modifies a length of a circuit board design.

FIG. 5 is a flowchart of a procedure 110 which is performed by the controller 28 in conjunction with the modeling subsystem 32 of the apparatus 20 (i.e., a computer operating in accordance with the computer program product 34 of FIG. 1) when modeling a circuit board structure 22 while the user effectuates a change to the length (L) of the circuit board structure 22 (FIG. 2). In this example, suppose that the user wishes to model a particular circuit board structure 22 as shown in FIG. 2 and then see how a change to the length (L) of the circuit board structure 22 affects performance.

In step 112, the controller 28 receives a set of global circuit board dimension parameters from a user through the input device 26. This set of dimension parameters or values is the contents of certain variables 80 in FIG. 4, and defines a set of global circuit board dimensions of a circuit board structure 22 (e.g., also see the user information 36 in FIGS. 1 and 3). For example, the value stored in the PCB length variable 82 defines the global length of the circuit board structure 22 (i.e., the PCB length (L)), the value stored in the PCB width variable 84 defines the global width of the circuit board structure 22 22 (i.e., the PCB width (W)), and so on.

In step 114, the controller 28 forms, for each layer 24 of the circuit board structure 22, a set of individual circuit board dimension parameters defining a set of individual circuit board dimensions for that layer 24 based on the set of global circuit board dimension parameters. For example, the controller 28 creates and sets the individual length of each layer 24 equal to the PCB length (L) by copying the contents of the PCB length variable 82 into each layer length variable 90 (FIG. 4). Similarly, the controller 28 sets the width of each layer 24 equal to the PCB width (W) by copying the contents of the PCB width variable 84 into each layer width variable 92. This step alleviates the need for the user to manually set the length and width of each layer 24 which would otherwise be a potential source of user error.

In step 116, the controller 28 provides, through the output device 30 (FIG. 1), a script 38 for use by the 3D modeling subsystem 32 which is configured to three-dimensionally model the circuit board structure 22. As a result, the script 38 includes a set of circuit board design values based on the set of individual circuit board dimension parameters formed for each layer 24, and the 3D modeling subsystem 32 is capable of effectively modeling the circuit board structure 22 based on the script 38. In some arrangements, the controller 28 generates a set of files in comma separated value (CSV) format for use by a traditional modeling package as the 3D modeling subsystem 32.

At this point, it should be understood that the modeling subsystem 32 is capable of easily accommodating a user change to the circuit board structure 22. In particular, suppose that the user now wishes to modify the length (L) of the circuit board structure 22. To effectuate such a change, the user does not need to manually change the length setting for each individual layer 24 of the circuit board structure 22 which would take time and provide a high risk for user error. Rather, the user simply changes the value stored in the PCB length variable 82 which globally defines the PCB length (L). In response, in step 118, the modeling subsystem 32 receives this new global length value from the user, and stores this as the new contents of the PCB length variable 82 (FIG. 4). Additionally, the modeling subsystem 32 automatically updates the individual length values for each layer 24 based on the new global circuit board length value. In particular, the modeling subsystem 32 copies the contents of the PCB length variable 82 into each layer length variable 90 (FIG. 4) thus alleviating the need for the user to manually modify the individual layer settings.

In step 120, the modeling subsystem 32 automatically updates the script 38 to reflect the user changes. The modeling subsystem 32 of the apparatus 20 subsequently models the circuit board design 22 based on the new script 38, i.e., based on the automatically updated length changes to the length variables 90 for the individual circuit board layers 24. Further details will now be provided with reference another modeling example and FIG. 6.

Figure 6:
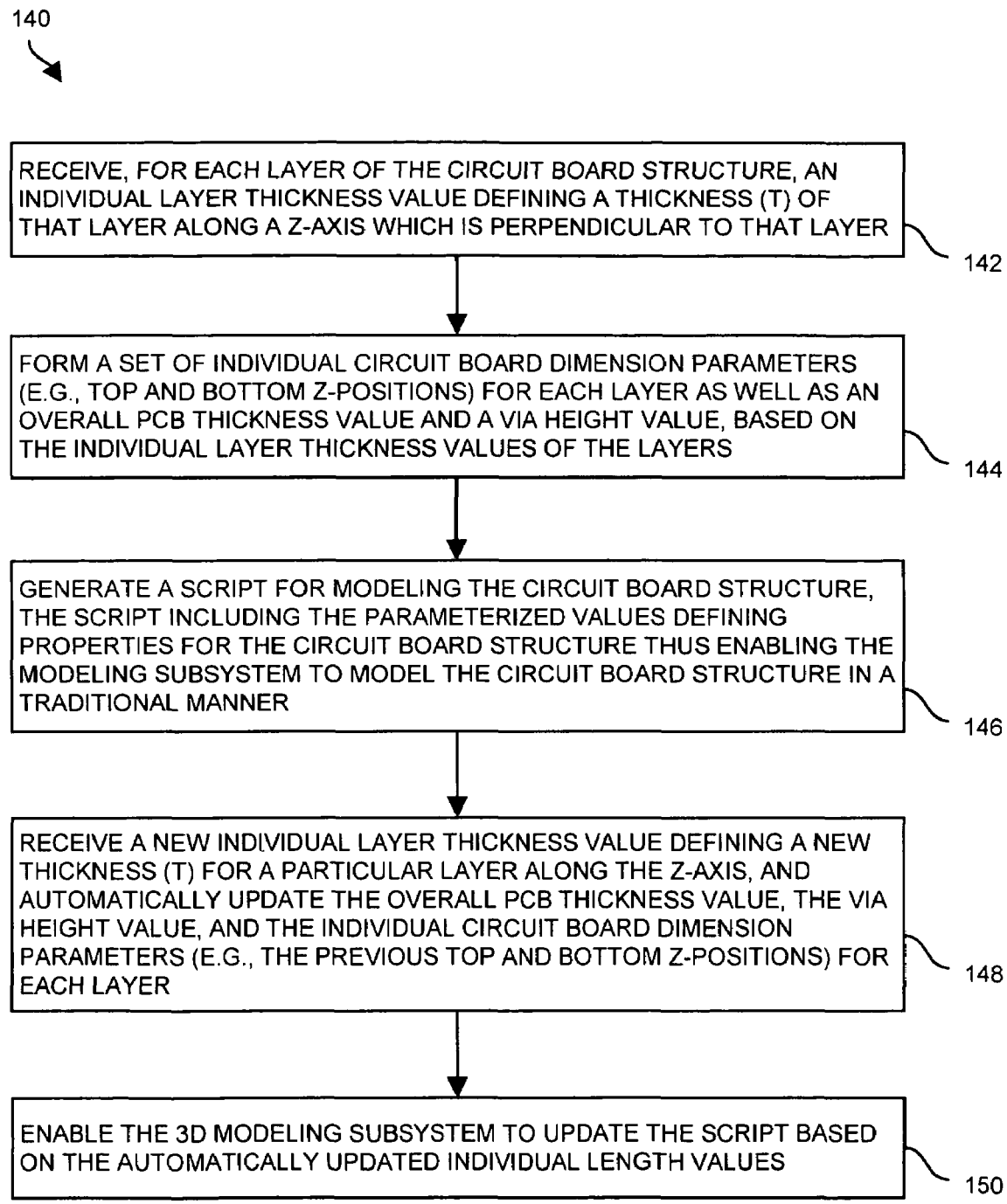
FIG. 6 is a flowchart of a procedure which is performed by the apparatus of FIG. 1 when the user modifies a thickness of a particular layer of a circuit board design.

FIG. 6 is a flowchart of a procedure 140 which is performed by the controller 28 in conjunction with the modeling subsystem 32 of the apparatus 20 when modeling a circuit board structure 22 while the user effectuates a change to the thickness (T) of a particular layer 24 of the circuit board structure 22 (FIG. 2). In this example, suppose that the user wishes to model the particular circuit board structure 22 as shown in FIG. 2 and then see how a change to the thickness (T) of layer_2 of the circuit board structure 22 affects performance.

In step 142, the controller 28 receives, for each layer 24 of the circuit board structure 22, an individual layer thickness value defining a thickness (T) of that layer 24 along a Z-axis which is perpendicular to that layer 24 from the user (also see FIG. 1). In particular, the controller obtains values defining layer thicknesses from the user through the input device 26 (FIG. 1) and stores these values in the layer thickness variables 86. This operation typically occurs contemporaneously with receipt of other circuit board properties from the user (e.g., see step 112 of the procedure 110 in FIG. 5).

In step 144, the controller 28 forms a set of individual circuit board dimension parameters for each layer 24. In particular, the controller 28 automatically provides Z-axis positions for each layer 24 based on the individual layer thickness values of the multiple layers 24 of the circuit board structure 22. This feature is illustrated in FIG. 4 where there are arrows leading from the layer thickness variables 86 (containing data entered by the user) to the layer top and bottom Z-position variables 96, 98 for each layer 24. Only the variables 96(1), 98(1) for layer_1 are shown in FIG. 4 for simplicity.

Also, as part of step 144, the controller 28 automatically utilizes the values in the layer thickness variables 86 to determine the values for other properties of the circuit board structure 22. For example, as shown in FIG. 4, the layer thicknesses (i.e., the contents of the variables 86) are used to determine the overall thickness of the circuit board structure 22 (i.e., a sum of the individual layer thickness values stored within the PCB thickness variable 94). In turn, the controller 28 automatically utilizes the overall thickness of the circuit board structure 22 to establish the height of the vias 52 (i.e., the value stored within the via height variable 102, see FIG. 4).

In step 146, the controller 28 generates a script 38 for modeling the circuit board structure 22. The script 38 includes parameterized values defining properties for the circuit board structure 22 (e.g., the various PCB thickness, via height and layer properties, and so on). The modeling subsystem 32 then uses the generated script 38 to model the circuit board structure 22 in a traditional manner.

Now suppose that the user wishes to modify the thickness (T) of a particular layer 24. The user enters the new thickness into the modeling subsystem 32 of the apparatus 20. As shown in step 148, the modeling subsystem 32 receives, from the user, a new individual layer thickness value defining a new thickness (T) of a particular layer along the Z-axis (recall that the Z-axis extends perpendicularly through each of the layers 24, also see FIG. 2). In response to such receipt, the modeling subsystem 32 automatically updates the new Z-positions for the layers 24, the overall PCB thickness (i.e., the contents of the PCB thickness variable 94) and the height value for each via 52 (i.e., the contents of the via height variable 102). Accordingly, the user does not need to manually re-calculate properties for the vias 52 (e.g., new via height) and for the individual layers 24 (e.g., new Z-positions).

In step 150, the modeling subsystem 32 updates the script 38 to reflect the changes made by the user. The new script 38 includes the automatically updated values for the various properties of the circuit board structure 22 thus enabling the user to conveniently analyze design changes to the structure 22. As a result, the apparatus 20 does not burden the user by requiring the user to manually change other values individually. Rather, the script 38 created by the controller 28 is capable of propagating a single change by the user to other dependent values automatically. Further details will now be provided with reference to FIG. 7.

Figure 7:
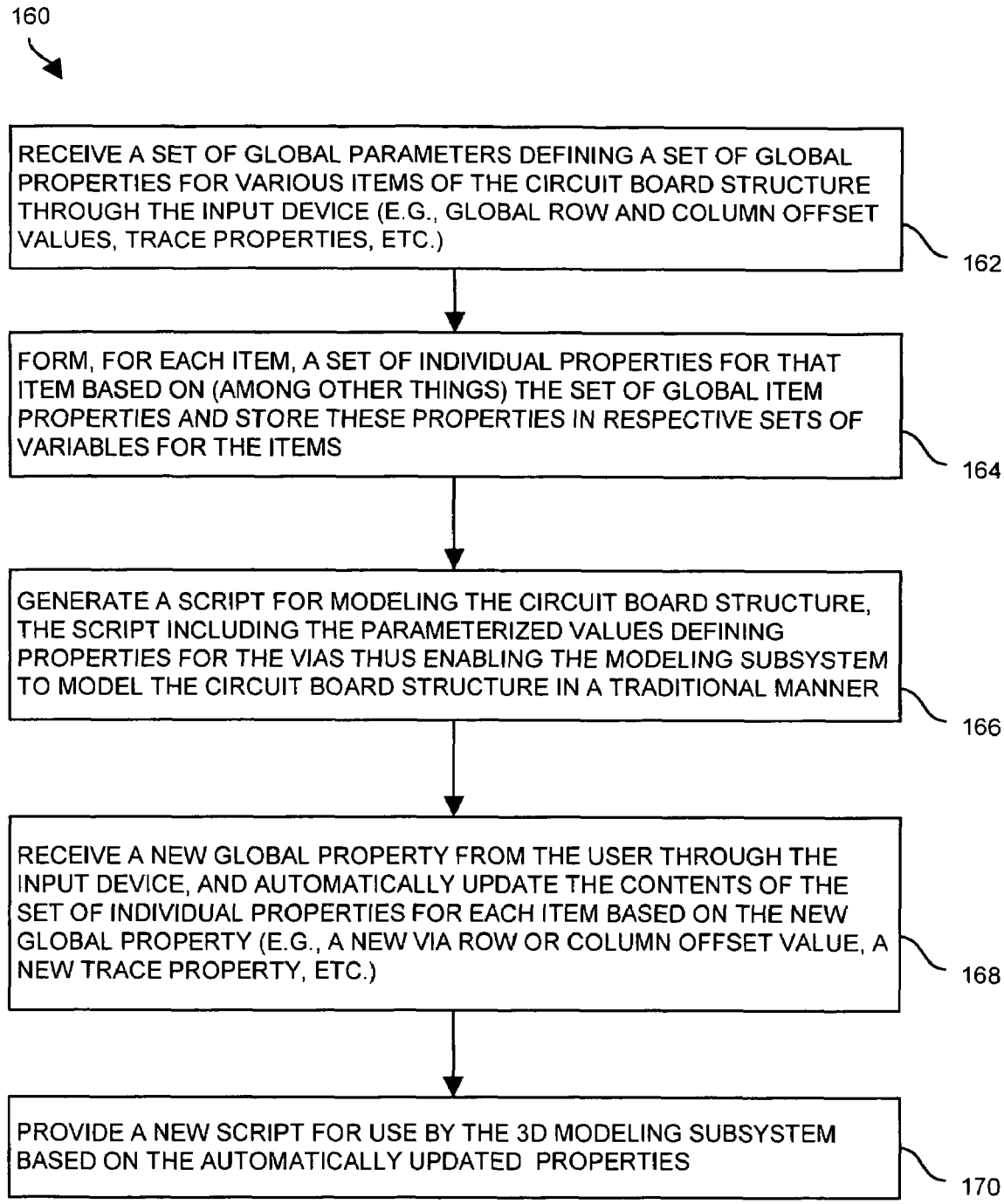
FIG. 7 is a flowchart of a procedure which is performed by the apparatus of FIG. 1 when the user modifies a via offset dimension of a circuit board design.

FIG. 7 is a flowchart of a procedure 160 which is performed by the controller 28 in conjunction with the modeling subsystem 32 of the apparatus 20 when modeling a circuit board structure 22 while the user effectuates a change to a via property for the circuit board structure 22 (FIG. 2). In this example, suppose that the user wishes to model the particular circuit board structure 22 as shown in FIG. 2 and then see how a change to the via row offset value of the circuit board structure 22 affects performance.

In step 162, the controller 28 receives a set of global via parameters from the user through the input device 26. The set of global via parameters defines, among other things, a set of global via properties of the set of vias 52 of the circuit board structure 22. The properties include a global row offset value to be stored in the via row offset variable 88(R) and a global column offset value to be stored in the via column offset variable 88(C) (FIG. 4). The global row offset value indicates a distance between via rows. Similarly, the global column offset value indicates a distance between via columns.

In step 164, the controller 28 automatically forms, for each via 52, a set of individual via properties for that via 52 based on the set of global via parameters (i.e., the contents of the variables 88) and the height value for that via (i.e., the earlier-mentioned content of the via height variable 102). In particular, the controller 28 creates respective coordinates for each via 52, and stores these coordinates in respective sets of variables 100(1), 100(2), . . . (collectively, variables 100, see FIG. 4).

In step 166, the controller 28 generates a script 38 for modeling the circuit board structure 22. The script 38 includes parameterized values defining properties for the circuit board structure 22 (e.g., the values of the via variables 88, 100). The modeling subsystem 32 then uses the generated script 38 to model the circuit board structure 22 in a traditional manner.

Now suppose that the user wishes to modify the row offset value to specify a new distance between via rows. The user enters the row offset value into the modeling subsystem 32 of the apparatus 20. As shown in step 168, the modeling subsystem 32 receives, from the user, a new row offset value defining a new row offset for rows of the vias 52. In response to such receipt, the modeling subsystem 32 automatically updates the contents of the via coordinate variables which define the via coordinates (see the arrows between the variables 88 and 100 in FIG. 4). Accordingly, the user does not need to manually re-calculate each set of via coordinates.

In step 170, the modeling subsystem 32 updates the script 38 and the 3D model of the board structure reflects these changes. The new script 38 includes the automatically updated values for the various properties of the circuit board structure 22 thus enabling the user to conveniently analyze design changes to the structure 22. Accordingly, the apparatus 20 does not require the user to meticulously change other values individually. Rather, the controller 28 provides a dependency mechanism in which a single change made by the user is capable of propagating to other property values in an automated manner.

It should be understood that the controller 28 is configured to handle other circuit board properties in manners similar to those described above in connection with FIGS. 5 through 7. For instance, the procedure 160 of FIG. 7 can be applied to other circuit board items such as a set of circuit board traces 58 (see FIG. 2). Along these lines, the controller 28 receives a set of global trace parameters from the user (step 162) where the set of global trace parameters defines a set of global trace properties of the set of traces 58. The controller 28 is then configured to form, for each trace 58, a set of individual trace properties for that trace 58 based on the set of global trace parameters (step 164) and generate a script 38 (step 166). Accordingly, the script 38 includes a set of trace variables based on the set of individual trace properties for each trace 58. The modeling subsystem 32 is then capable of receiving a single change to a global parameter and automatically updating the dependent parameters (step 168) and generating a new script 38 based on the updated parameters (step 170) based on the single change to the global parameter. Such operation saves the user time and effort as well as reduces the likelihood of user error.

As described above, improved techniques utilize parameterization of particular circuit board dimensions to enable automatic propagation of changes to individual aspects of a circuit board structure 22 thus alleviating the need for a user to manually change certain the information for multiple circuit board layer and via properties. For example, if the user changes the thickness of a particular circuit board layer 24, the Z-positions of the other circuit board layers 24 and the via heights are automatically updated so that the user does not need to manually calculate and change the Z-axis positions of other circuit board layers 24 and so that the user does not need to manually change the via heights of any of the vias 52.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method for generating circuit board modeling data for a circuit board structure having multiple layers, the method comprising:
   receiving a set of global circuit board dimension parameters from a user, the set of global circuit board dimension parameters defining a set of global circuit board dimensions of the circuit board structure;
   forming, for each layer of the multiple layers of the circuit board structure, a set of individual circuit board dimension parameters defining a set of individual circuit board dimensions for that layer based on the set of global circuit board dimension parameters;
   providing a script for use by a three-dimensional modeling subsystem configured to three-dimensionally model the circuit board structure, the script including a set of circuit board design values based on the set of individual circuit board dimension parameters formed for each layer of the multiple layers of the circuit board structure; and
   receiving, for each layer of the multiple layers of the circuit board structure, an individual layer thickness value defining a thickness of that layer along a Z-axis from the user; and
   wherein forming the set of individual circuit board dimension parameters for each layer includes providing Z-axis positions for each layer based on the individual layer thickness values of the multiple layers of the circuit board structure.

2. A method as in claim 1 wherein receiving the set of global circuit board dimension parameters from the user includes obtaining a global circuit board length value and a global circuit board width value from the user; and
   wherein forming, for each layer of the multiple layers of the circuit board structure, the set of individual circuit board dimension parameters defining the set of individual circuit board dimensions for that layer based on the set of global circuit board dimension parameters includes creating an individual length value and an individual width value for each layer.

3. A method as in claim 2, further comprising:
   receiving a new global circuit board length value from the user; and
   automatically updating the individual length value for each layer based on the new global circuit board length value.

4. A method as in claim 1 wherein the circuit board structure further includes a set of vias; and wherein the method further comprises:
   establishing, for each via of the set of vias, a height value based on the individual layer thickness values of the multiple layers of the circuit board structure.

5. A method as in claim 4, further comprising:
   receiving, from the user, a new individual layer thickness value defining a new thickness of a particular layer of the multiple layers of the circuit board structure along the Z-axis; and
   automatically updating the height value for each via based on the new individual layer thickness value.

6. A method as in claim 4, further comprising:
   receiving a set of global via parameters from the user, the set of global via parameters defining a set of global via properties of the set of vias; and
   forming, for each via of the set of vias, a set of individual via properties for that via based on the set of global via parameters and the height value for that via, the script further including a set of via variables based on the set of individual via properties for each via of the set of vias.

7. A method as in claim 6 wherein receiving the set of global via parameters from the user includes obtaining a global via offset value indicating a distance between multiple vias; and
   wherein forming the set of individual via properties for each via includes establishing a distance between rows of vias based on the global via offset value.

8. A method as in claim 7, further comprising:
   receiving, from the user, a new global via offset value indicating a distance between multiple vias; and
   automatically updating the distance between the rows of vias based on the new global via offset value.

9. A method as in claim 4 wherein the circuit board structure further includes a set of traces; and wherein the method further comprises:
   receiving a set of global trace parameters from the user, the set of global trace parameters defining a set of global trace properties of the set of traces; and
   forming, for each trace of the set of traces, a set of individual trace properties for that trace based on the set of global trace parameters, the script further including a set of trace variables based on the set of individual trace properties for each trace of the set of traces.

10. A method as in claim 1, further comprising:
    receiving a replacement circuit board dimension parameter from the user, the replacement circuit board dimension parameter defining a particular dimension of a particular layer of the multiple layers of the circuit board structure; and
    in response to receiving the replacement circuit board dimension parameter, automatically modifying multiple replacement circuit board dimension parameters which correspond to the multiple layers of the circuit board structure.

11. An apparatus for providing circuit board modeling data for a circuit board structure having multiple layers, the apparatus comprising:

an input device;

an output device; and a controller coupled to the input and output devices, the controller being configured to:

receive a set of global circuit board dimension parameters from a user through the input device, the set of global circuit board dimension parameters defining a set of global circuit board dimensions of the circuit board structure;

form, for each layer of the multiple layers of the circuit board structure, a set of individual circuit board dimension parameters defining a set of individual circuit board dimensions for that layer based on the set of global circuit board dimension parameters;

provide, through the output device, a script for use by a three-dimensional modeling subsystem configured to three-dimensionally model the circuit board structure, the script including a set of circuit board design values based on the set of individual circuit board dimension parameters formed for each layer of the multiple layers of the circuit board structure; and receive, for each layer of the multiple layers of the circuit board structure, an individual layer thickness value defining a thickness of that layer along a Z-axis from the user; and wherein the controller, when forming the set of individual circuit board dimension parameters for each layer, is configured to provide Z-axis positions for each layer based on the individual layer thickness values of the multiple layers of the circuit board structure.

12. An apparatus as in claim 11 wherein the controller, when receiving the set of global circuit board dimension parameters from the user, is configured to obtain a global circuit board length value and a global circuit board width value from the user; and wherein the controller, when forming the set of individual circuit board dimension parameters for each layer of the multiple layers of the circuit board structure, is configured to create an individual length value and an individual width value for each layer.

13. An apparatus as in claim 12 wherein the apparatus further comprises the three-dimensional modeling subsystem; and wherein the controller in combination with the three-dimensional modeling subsystem are configured to:

receive a new global circuit board length value from the user; and automatically update the individual length value for each layer based on the new global circuit board length value.

14. An apparatus as in claim 11 wherein the circuit board structure further includes a set of vias; and wherein the controller is further configured to:

establish, for each via of the set of vias, a height value based on the individual layer thickness values of the multiple layers of the circuit board structure.

15. An apparatus as in claim 11 wherein the controller is further configured to:

receive a replacement circuit board dimension parameter from the user, the replacement circuit board dimension parameter defining a particular dimension of a particular layer of the multiple layers of the circuit board structure; and in response to receiving the replacement circuit board dimension parameter, automatically modify multiple replacement circuit board dimension parameters which correspond to the multiple layers of the circuit board structure.

16. A computer program product that includes a computer readable medium having instructions stored thereon for generating circuit board modeling data for a circuit board structure having multiple layers, such that the instructions, when carried out by a computerized device, cause the computerized device to:

receive a set of global circuit board dimension parameters from a user, the set of global circuit board dimension parameters defining a set of global circuit board dimensions of the circuit board structure;

form, for each layer of the multiple layers of the circuit board structure, a set of individual circuit board dimension parameters defining a set of individual circuit board dimensions for that layer based on the set of global circuit board dimension parameters;

provide a script for use by a three-dimensional modeling subsystem configured to three-dimensionally model the circuit board structure, the script including a set of circuit board design values based on the set of individual circuit board dimension parameters formed for each layer of the multiple layers of the circuit board structure; and receive, for each layer of the multiple layers of the circuit board structure, an individual layer thickness value defining a thickness of that layer along a Z-axis from the user; and wherein forming the set of individual circuit board dimension parameters for each layer includes providing Z-axis positions for each layer based on the individual layer thickness values of the multiple layers of the circuit board structure.

17. A computer program product as in claim 16 wherein receiving the set of global circuit board dimension parameters from the user includes obtaining a global circuit board length value and a global circuit board width value from the user; and wherein forming, for each layer of the multiple layers of the circuit board structure, the set of individual circuit board dimension parameters defining the set of individual circuit board dimensions for that layer based on the set of global circuit board dimension parameters includes creating an individual length value and an individual width value for each layer.

18. A computer program product as in claim 17 wherein the instructions, when carried out by the computerized device, further cause the computerized device to:

receive a new global circuit board length value from the user; and automatically update the individual length value for each layer based on the new global circuit board length value.

19. A computer program product as in claim 16 wherein the circuit board structure further includes a set of vias; and wherein the instructions, when carried out by the computerized device, further cause the computerized device to:

establish, for each via of the set of vias, a height value based on the individual layer thickness values of the multiple layers of the circuit board structure.

20. A computer program product as in claim 16 wherein the instructions, when carried out by the computerized device, further cause the computerized device to:

receive a replacement circuit board dimension parameter from the user, the replacement circuit board dimension parameter defining a particular dimension of a particular layer of the multiple layers of the circuit board structure; and in response to receiving the replacement circuit board dimension parameter, automatically modify multiple replacement circuit board dimension parameters which correspond to the multiple layers of the circuit board structure.

* * * * *